United States Patent
Wang et al.

(10) Patent No.: US 7,122,736 B2
(45) Date of Patent: Oct. 17, 2006

(54) METHOD AND APPARATUS FOR FABRICATING A THIN-FILM SOLAR CELL UTILIZING A HOT WIRE CHEMICAL VAPOR DEPOSITION TECHNIQUE

(75) Inventors: Qi Wang, Littleton, CO (US); Eugene Iwaniczko, Lafayette, CO (US)

(73) Assignee: Midwest Research Institute, Kansas City, MO (US)

( * ) Notice: Subject to any disclaimer, the term of this patent is extended or adjusted under 35 U.S.C. 154(b) by 0 days.

(21) Appl. No.: 10/485,715

(22) PCT Filed: Aug. 16, 2001

(86) PCT No.: PCT/US01/25659

§ 371 (c)(1),
(2), (4) Date: Jan. 30, 2004

(87) PCT Pub. No.: WO03/017384

PCT Pub. Date: Feb. 27, 2003

(65) Prior Publication Data

US 2004/0168717 A1    Sep. 2, 2004

(51) Int. Cl.
*H01L 31/20* (2006.01)
*H01L 31/18* (2006.01)
*H01L 31/075* (2006.01)

(52) U.S. Cl. ............... 136/258; 136/261; 136/255; 136/249; 438/96; 438/74; 257/431; 257/458; 427/74; 427/588; 427/593

(58) Field of Classification Search ............ 136/258, 136/261, 255, 249; 438/96, 74; 118/715, 118/723 E, 724, 723 HC; 257/431, 458; 427/74, 588, 593
See application file for complete search history.

(56) References Cited

U.S. PATENT DOCUMENTS

| | | | |
|---|---|---|---|
| 4,237,150 A * | 12/1980 | Wiesmann | 438/479 |
| 4,728,370 A | 3/1988 | Ishii et al. | |
| 5,230,753 A | 7/1993 | Wagner | |
| 5,231,690 A * | 7/1993 | Soma et al. | 392/416 |
| 5,252,142 A * | 10/1993 | Matsuyama et al. | 136/255 |
| 5,324,364 A * | 6/1994 | Matsuda et al. | 136/249 |
| 5,397,737 A | 3/1995 | Mahan et al. | |
| 5,776,819 A | 7/1998 | Mahan et al. | |
| 5,827,773 A | 10/1998 | Voutsas | |

(Continued)

FOREIGN PATENT DOCUMENTS

JP    10 125944 A    5/1998

OTHER PUBLICATIONS

Jones et al, "a-Si:H based Triple-Junction Cells Prepared at i-layer Deposition Rates of 10 A/s using a 70 MHz PECVD Technique," 28th Photovoltaic Specialists Conference, Sep. 15-22, 2000, pp. 845-848.*

(Continued)

*Primary Examiner*—Alan Diamond
(74) *Attorney, Agent, or Firm*—Paul J. White

(57) ABSTRACT

A thin-film solar cell is provided. The thin-film solar cell comprises an a-SiGe:H (1.6 eV) n-i-p solar cell having a deposition rate of at least ten (10) Å/second for the a-SiGe:H intrinsic layer by hot wire chemical vapor deposition. A method for fabricating a thin film solar cell is also provided. The method comprises depositing a n-i-p layer at a deposition rate of at least ten (10) Å/second for the a-SiGe:H intrinsic layer.

23 Claims, 3 Drawing Sheets

U.S. PATENT DOCUMENTS

| | | | |
|---|---|---|---|
| 5,851,904 A | | 12/1998 | Schwarz et al. |
| 5,959,314 A | | 9/1999 | Voutsas |
| 6,028,393 A | * | 2/2000 | Izu et al. ............... 315/111.01 |
| 6,080,998 A | * | 6/2000 | Shima et al. ................ 257/55 |
| 6,124,186 A | | 9/2000 | Molenbroek et al. |
| 6,124,545 A | | 9/2000 | Bauer et al. |
| 6,180,870 B1 | | 1/2001 | Sano et al. |
| 6,258,408 B1 | * | 7/2001 | Madan et al. ............ 427/255.5 |
| 6,349,669 B1 | * | 2/2002 | Matsumura et al. .. 118/723 HC |
| 6,468,885 B1 | * | 10/2002 | Mahan et al. ............... 438/482 |
| 6,638,839 B1 | * | 10/2003 | Deng et al. ................ 438/485 |
| 2004/0265211 A1 | * | 12/2004 | Dillon et al. ............ 423/447.3 |

OTHER PUBLICATIONS

Wang et al, "High-quality 10 A/s amorphous silicon germanium alloy solar cells by hot-wire CVD," preprint of a conference paper, NREL, Oct. 2001.*

Nelson, Brent P. et al., "Hydrogenated Amorphous Silicon Germanium Alloys Grown by the Hot Wire Chemical Vapor Deposition Technique," Mat. Res. Soc. Symp. Proc. vol. 507, 1998 Materials Research Society, pp. 447-452.

Lill, M. and Schrode, B. "Preparation of amorphous hydrogenated silicon-germanium material and solar cells using the thermocatalytic chemical vapor deposition," Appl. Phys. Ltrs, vol. 74, No. 9, Mar. 1, 1999, pp. 1284-1288.

Guha, S. et al., "Microwave Glow-Discharge Deposition of Amorphous Silicon Based Alloys at High Deposition Rates for Solar Cell Application," Mat. Res. Soc. Symp. Proc. vol. 377, 1995 Materials Research Society, pp. 621-627.

Nelson, Brent P. et al., "Low Hydrogen Content, High Quality Hydrogenated Amorphous Silicon Thin-Films: Fundamentals to Devices," Mat. Res. Soc. Symp. Proc. vol. 557, 1999 Materials Research Society, pp. 97-102.

Mahan, A.H. et al., "H Out-Diffusion and Device Performances in n-i-p Solar Cells Utilzing High Temperature Hot Wire a-Si:H i-Layers," Mat. Res. Cos. Symp. Proc. vol. 507, 1998 Materials Research Society, pp. 119-124.

Jones, S.J. et al., "a-Si:H-based Triple-Junction Cells Prepared at i-layer Deposition Rates of 10 A/s Using a 70 MHz PECVD Technique," Photovoltaic Specialists Conference, 2000, 28-IEEE, Sep. 2000, pp. 845-848.

* cited by examiner

The deposition parameters and range for the a-SiGe:H optimization.

| Parameters | Range |
|---|---|
| $SiH_4$ (sccm) | 30-50 |
| $H_2$ (sccm) | 0-190 |
| $GeH_4$ (sccm) | 0-12.5 |
| P (mT) | 20-50 |
| $T_{sub}$ (°C) | 200-350 |
| Dep. Time (min) | 2-5 |
| Steps of i-layer | 1-4 |

FIG. 4

The best process parameters of a-SiGe:H 3-step i-layer.

| | $SiH_4$ (sccm) | $GeH_4$ (sccm) | Ge/Si Ratio (%) | $H_2$ (sccm) | $T_{sub}$ (°C) | P (mT) | I (A) | V (V) | Dep. Time (sec) |
|---|---|---|---|---|---|---|---|---|---|
| i-layer 1 | 50 | 0 | 0 | 150 | 300 | 42 | 16 | 12.4 | 90 |
| i-layer 2 | 50 | 4.3 | 8 | 150 | 300 | 43 | 16 | 12.4 | 90 |
| i-layer 3 | 50 | 9.5 | 16 | 150 | 300 | 45 | 16 | 12.4 | 90 |

FIG. 5

METHOD AND APPARATUS FOR FABRICATING A THIN-FILM SOLAR CELL UTILIZING A HOT WIRE CHEMICAL VAPOR DEPOSITION TECHNIQUE

CONTRACTUAL ORIGIN OF THE INVENTION

The United States Government has rights in this invention under Contract No. DE-AC36-99GO10337 between the United States Department of Energy and the National Renewable Energy Laboratory, a division of the Midwest Research Institute.

TECHNICAL FIELD

This invention relates generally to a thin-film solar cell and, more particularly, it relates to an apparatus and process to fabricate an a-SiGe:H 1.6 eV optical gap n-i-p solar cell at a deposition rate of ten (10) Å/s for the a-SiGe:H intrinsic layer using hydrogen dilution by the hot-wire chemical vapor deposition (CVD) technique.

BACKGROUND ART

With concerns about rising fuel costs, energy security, statewide brownouts, and demand surges that exceed electrical supply, solar electric systems are needed to meet a greater share of energy needs. Photovoltaic devices, i.e., solar cells, are capable of converting solar radiation into usable electrical energy. The energy conversion occurs as the result of what is known as the photovoltaic effect. Solar radiation impinging on a solar cell and absorbed by an active region of semiconductor material generates electricity.

In recent years, technologies relating to thin-film solar cells have been advanced to realize inexpensive and lightweight solar cells and, therefore, thinner solar cells manufactured with less material have been demanded. This is especially true in the space industry with the solar cells powering satellites and other space vehicles.

The current state of the art in solar cell design is to deposit a photoactive material onto a substrate. Hydrogenated amorphous silicon-germanium (a-SiGe:H) alloy accounts for over half the materials in most commercial multi-junction amorphous silicon thin film solar cells. a-SiGe:H has been used in the tandem and triple-junction solar cells to improve the red response. However, a-SiGe:H alloy has poorer electronic properties than a-Si:H because of higher defect densities, weaker hydrogen bonds and other structural defects. This problem is more pronounced for low bandgap a-SiGe:H alloy with Ge content greater than 50%. In addition, the cost of germanium gas is high.

Various techniques have been tried to improve the property of the a-SiGe:H alloy. Growing a-SiGe:H alloy near the threshold of microcrystallinity using hydrogen dilution at low deposition rate (~1 Å/s) by rf plasma-enhanced CVD (PECVD) and applied graded alloy layers were two of many techniques that have significantly improved a-SiGe:H solar cell performance. Despite the recent development of a microcrystalline silicon (μc-Si) solar cell and its potential of replacing a-SiGe:H materials, a-SiGe:H solar cell exhibits higher open circuit voltage ($V_{oc}$), a tunable bandgap, and potential for further improvement. With these considerations, a-SiGe:H alloys are still considered as promising materials for use in commercial a-Si:H based solar cells fabrications.

Deposition rate is one of the important factors to increase the throughput and reduce the capital cost for PV production. The deposition rate of the photoactive material onto the substrate has been, typically, approximately one (1) Å/second or less with a typical ten (10%) percent stable efficiency for a-Si:H solar cells. It is even more crucial for a-SiGe:H because of the large amount of materials used in the solar cells. The best a-Si:H based solar cells are made at the deposition rate about 1 Å/s. Up to date, the properties of the high deposition rate (greater than 1 Å/s) materials remain inferior to the one at 1 Å/s. The efficiency of the high rate solar cells, as a consequence, is lower than the ones at 1 Å/s.

Accordingly, the time to manufacture the solar cell increases the cost of manufacture thereby increasing the cost to the ultimate user. In the very near future, to further increase the volume of production of solar cells to meet the high demand, an efficient high deposition rate will be required.

Accordingly, there exists a need for a thin-film solar cell fabricated with a high deposition rate. Additionally, a need exists for a thin-film solar cell with a high deposition rate and increased efficiency. Furthermore, there exists a need for a thin-film solar cell fabricated with a high deposition rate utilizing a hot wire chemical vapor deposition technique with optimum parameters to achieve efficient high deposition rates of approximately ten (10) Å/second.

DISCLOSURE OF INVENTION

The present invention is a thin-film solar cell. The thin-film solar cell comprises an a-SiGe:H (1.6 eV) n-i-p solar cell having a deposition rate of at least ten (10) Å/second for the a-SiGe:H intrinsic layer by a hot wire chemical vapor deposition technique.

The present invention additionally includes a method for fabricating a thin film solar cell. The method comprises depositing an n-i-p layer at a deposition rate of at least ten (10) Å/second for the a-SiGe:H intrinsic layer.

The present invention further includes means for depositing an a-SiGe:H intrinsic layer at a deposition rate of at least ten (10) Å/second.

BRIEF DESCRIPTION OF DRAWINGS

The accompanying drawings, which are incorporated in and form a part of the specification, illustrate the preferred embodiments of the present invention, and together with the descriptions serve to explain the principles of the invention.

FIG. 4 is a table of the variables in the optimization process of the present invention;

FIG. 5 is a table of the best parameters of the process of the present invention with the i-layer having three layers, namely, the first layer, the second layer, and the third layer.

BEST MODE FOR CARRYING OUT THE INVENTION

Figure 1:
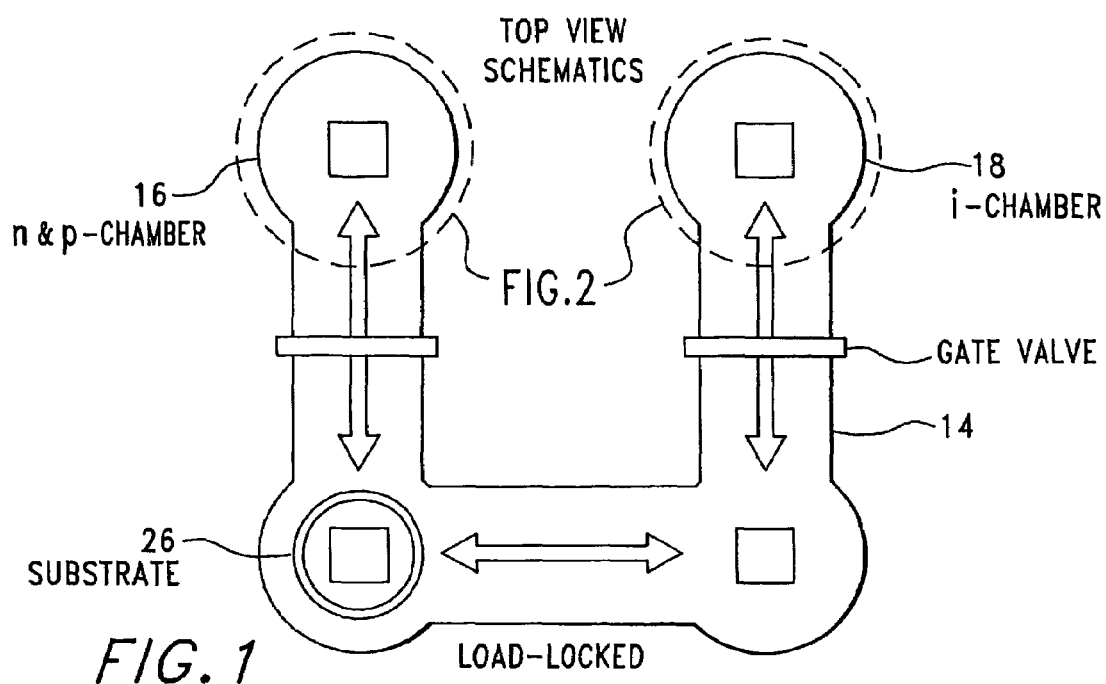
FIG. 1 is a top schematic view of a T-system for fabricating a thin film solar cell utilizing a hot wire chemical vapor deposition technique, constructed in accordance with the present invention.
Figure 3:
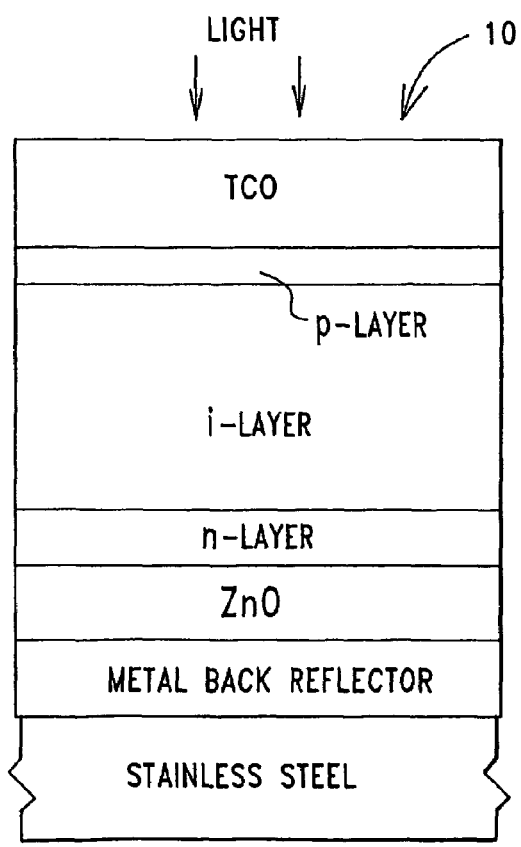
FIG. 3 is a sectional view of the thin film solar cell utilizing a hot wire chemical vapor deposition technique of FIG. 1, constructed in accordance with the present invention.

As illustrated in FIG. 1, the present invention is a process to fabricate a high deposition rate a-SiGe:H (1.6 eV) n-i-p solar cell 10 (as illustrated in FIG. 3) at a deposition rate of approximately ten (10) Å/second for the a-SiGe:H intrinsic layer using hydrogen dilution by the hot-wire chemical vapor deposition technique (as illustrated in FIG. 1). The inventors of the present application have found the optimal process parameters for constructing the a-SiGe:H (1.6 eV) n-i-p solar cell 10 that significantly reduces cost and increase throughput for a-Si solar cells 10.

The inventors of the invention of the present application have found that in constructing the a-SiGe:H (1.6 eV) n-i-p solar cell 10, the maximum power ($P_{max}$) after 530 nm cut-off filter has been above four (4) mW/cm². This means that the solar cell 10 will contribute more than four (4%) percent efficiency in the tandem or triple junction a-Si:H solar cell 10. With conventional solar cells, the best $P_{max}$ after 530 nm cut-off filter of a-SiGe:H solar cell is just over five (5) mW/cm₂ at one (1) Å/second, and about four (4) mW/cm² for three (3) and six (6) Å/second. The solar cell 10 of the present invention offers significant improvement over conventional solar cells in deposition rate and efficiency thereby reducing the costs in construction of the solar cell 10.

Figure 2:
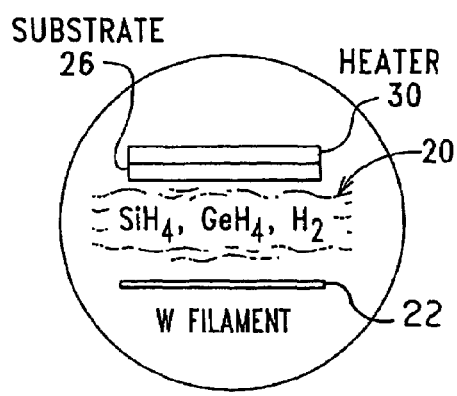
FIG. 2 is an exploded view of the n/p chamber and the i-chamber of the T-system of FIG. 1 for fabricating the thin film solar cell utilizing a hot wire chemical vapor deposition technique, constructed in accordance with the present invention.

In this two-chamber load-locked system 14, one chamber (i-chamber) 18 is only used to grow the a-SiGe:H intrinsic layer; the other chamber (dopant chamber) 16 is used to grow doped layers. As shown in FIG. 2, a spiral tungsten (W) wire 22 with a diameter of approximately 0.5 mm is positioned approximately 5 cm below the heated substrate. A heater 30 can be mounted to or placed in contact with the substrate 26. The tungsten filament 22 is heated to about 2100° C. by using an AC current. A process gas 20 preferably consisting of $SiH_4$, $GeH_4$, and $H_2$ passes by the hot filament 22, dissociates, and leads to Si/Ge/H deposition on the substrate 26. With the aid of a load-lock system 14 (see FIG. 1), the substrate 26 can be transported between two chambers 16 and 18 and minimizing the cross contamination in solar cell fabrication.

As illustrated in FIG. 3, the single junction solar cell 10 of the present invention has a structure of gl/TCO/p-i-/Ag or SS/Ag/n-i-p/TCO. The TCO layer is a transparent conducting oxide layer comprising, for instance, ZnO, indium tin oxide (ITO), or $SnO_2$. Tandem and triple-junction solar cells 10 are also within the scope of the present invention by adding additional p-i-n layers or n-i-p layers, respectively.

The Ge concentration in the film, substrate temperature, hydrogen dilution, multi-step i-layer, chamber pressure, and deposition time has been varied in the optimization process to focus on achieving the ten (10) Å/second deposition rate a-SiGe:H. The inventors of the present application have discovered that the hydrogen dilution and multi-step i-layer are the key variables that lead to improve the solar cell 10 efficiency. For the a-SiGe:H i-layer materials with a deposition rate greater than ten (10) Å/second, multiple filaments, higher $SiH_4$ flow rate, higher pressure, and higher filament current will be used.

Figure 6:
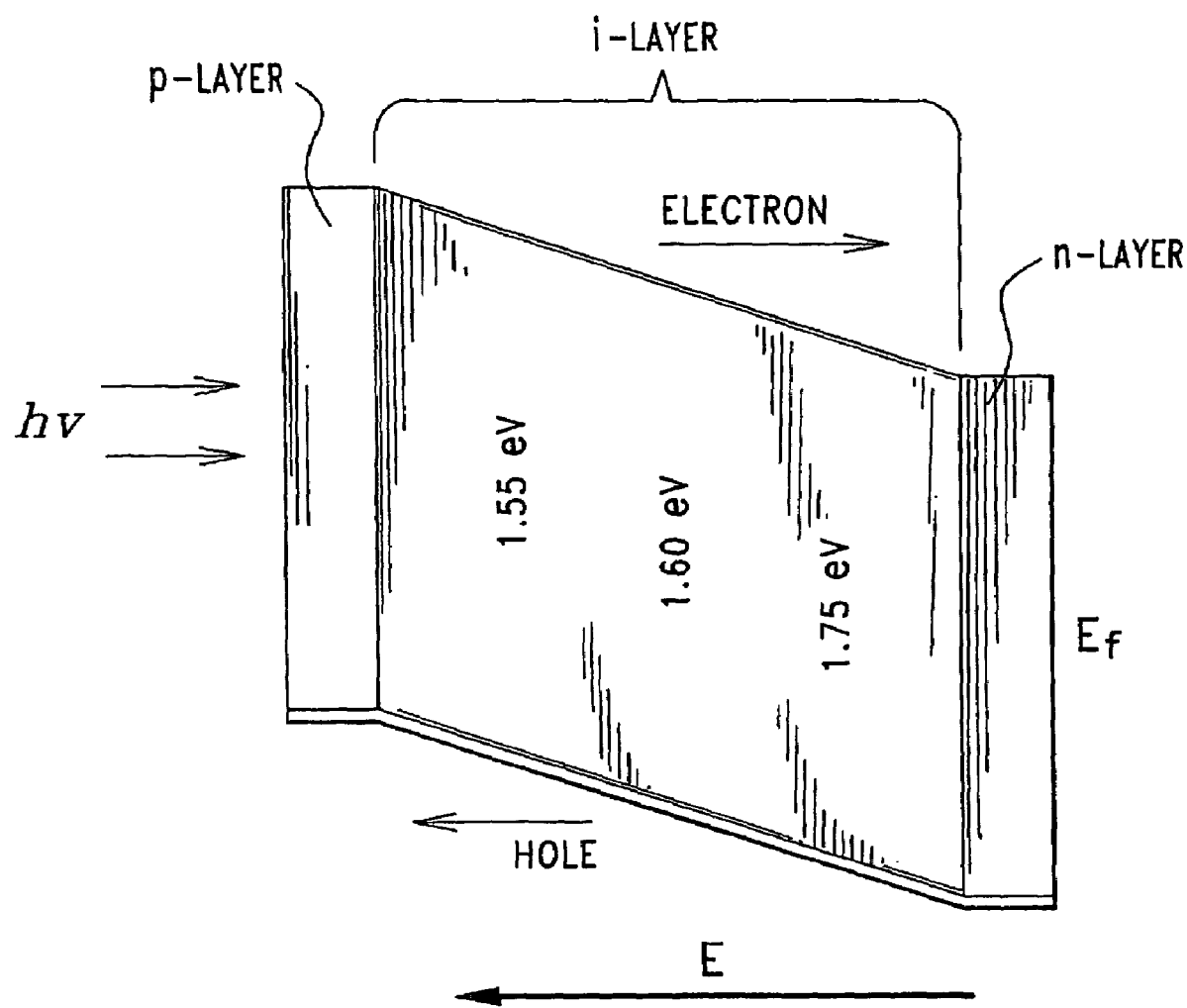
FIG. 6 is schematic view of the graded a-SiGe:H i-layer in the solar cell, constructed in accordance with the present invention.

FIG. 4, table 1, lists the variables in the optimization process. FIG. 5, table 2, illustrates the best parameters of the process. As illustrated therein, the i-layer has three layers, namely, the first layer, the second layer, and the third layer. Note: The total thickness of the i-layer is about 2600 Å and achieved using a single filament. FIG. 6 illustrates the graded a-SiGe:H I-layer of the solar cell 10.

The optimum deposition parameters for the n-layer, the i-layer, and the p-layer are as follows:

n-layer:

| | |
|---|---|
| $T_{sub}$ (° C.): | 250 |
| $SiH_4$ flow rate (sccm): | 25 |
| 5% $H_2PH3$ flow rate (sccm): | 5 |
| Pressure (mT): | 12 |
| Deposition time (sec): | 60 |
| Filament current (A): | 16 | i-layer:
See Table 2.

p-layer:

| | |
|---|---|
| $T_{sub}$ (° C.): | 170 |
| $SiH_4$ flow rate (sccm): | 3 |
| $H_2$ flow rate (sccm): | 100 |
| TMB flow rate (sccm): | 6 |
| Pressure (mT): | 70 |
| Deposition time (sec): | 50 |
| Filament current (A): | 16 |

With the solar cell 10 of the present invention utilizing the above parameters, the best cell performance after 530 nm cut-off filter is $V_{oc}$=0.770 V, FF=0.677, $J_{sc}$=8.08 mA/cm², and $P_{mzx}$=4.21 mW/cm². This achieves an efficient high deposition rate solar cell with a deposition rate of approximately ten (10) Å/second.

In conclusion, the present invention is a high performance 1.6 eV solar cell 10 having an active layer deposited by hot wire chemical vapor deposition at a rate of ten (10) Å/s. A power output of 4.2 mW/cm₂ was measured through a 530 nm long pass filter. The double-junction solar cell 10 can exhibit an initial 11.7% and stable 9.6% active-area efficiency thereby allowing fabrication of high-efficiency amorphous silicon solar cells 10 at higher deposition rates, an important result for low-cost production of PV modules.

The foregoing exemplary descriptions and the illustrative preferred embodiments of the present invention have been explained in the drawings and described in detail, with varying modifications and alternative embodiments being taught. While the invention has been so shown, described and illustrated, it should be understood by those skilled in the art that equivalent changes in form and detail may be made therein without departing from the true spirit and scope of the invention, and that the scope of the present invention is to be limited only to the claims except as precluded by the prior art. Moreover, the invention as disclosed herein, may be suitably practiced in the absence of the specific elements which are disclosed herein.

The invention claimed is:

1. A method for fabricating a thin film solar cell, the method comprising: forming an n-type semiconductor layer; forming a p-type semiconductor layer; forming two or more hydrogenated amorphous silicon-germanium (a-SIGe:H) intrinsic layers between the n-type semiconductor layer and the p-type semiconductor layer wherein at least one of the hydrogenated amorphous silicon-germanium (a-SiGe:H)

intrinsic layers is formed using hot wire chemical vapor deposition with a filament positioned in a chamber parallel to the at least one formed layer and wherein two adjacent amorphous silicon-germanium (a-SiGe:H) intrinsic layers, each having a constant germanium to silicon percentage ratio (Ge/Si), form a step in germanium to silicon percentage ratio (Ge/Si).

2. A method as defined in claim 1, wherein the hot wire chemical vapor deposition comprises use of a filament comprising tungsten.

3. A method as defined in claim 1, wherein the two or more a-SiGe:H intrinsic layers comprise three intrinsic layers formed using hot wire chemical vapor deposition.

4. A method as defined in claim 1, wherein the two or more a-SiGe:H intrinsic layers are formed using hot wire chemical vapor deposition including $SiH_4$ flowed at a rate of from 30 to 50 sccm, $H_2$ flowed at a rate of from 0 to 190 sccm, and $GeH_4$ flowed at rate of up to 12.5 sccm.

5. A method as defined in claim 1, wherein the two or more a-SiGe:H intrinsic layers are formed in a chamber having a pressure from 20 to 50 mT using hot wire chemical vapor deposition including $SiH_4$ flowed at a rate of from 30 to 50 sccm, $H_2$ flowed at a rate of from 0 to 190 sccm, and $GeH_4$ flowed at a rate up to 12.5 sccm.

6. A method as defined in claim 1 wherein the two or more a-SiGe:H intrinsic layers comprise a second intrinsic layer and a third intrinsic layer, and the solar cell further comprises a first intrinsic layer.

7. A method as defined in claim 6 wherein the first intrinsic layer is formed using hot wire chemical vapor deposition including $SiH_4$ flowed at a rate of approximately 50 sccm and $H_2$ flowed at a rate of approximately 150 sccm.

8. A method as defined in claim 6 wherein the first intrinsic layer is formed using hot wire chemical vapor deposition including $SiH_4$ flowed at a rate of approximately 50 sccm, $H_2$ flowed at a rate of approximately 150 sccm, and a deposition time of approximately 90 seconds.

9. A method as defined in claim 6 wherein the first intrinsic layer is formed in a chamber having a pressure of approximately 42 mT using hot wire chemical vapor deposition including $SiH_4$ flowed at a rate of approximately 50 sccm, $H_2$ flowed at a rate of approximately 150 sccm, and a deposition time of approximately 90 seconds.

10. A method as defined in claim 6 wherein the second intrinsic layer is formed using hot wire chemical vapor deposition including $SiH_4$ flowed at a rate of approximately 50 sccm, $GeH_4$ flowed at a rate of approximately 4.3 sccm, and $H_2$ flowed at a rate of approximately 150 sccm.

11. A method as defined in claim 6 wherein the second intrinsic layer is formed using hot wire chemical vapor deposition including $SiH_4$ flowed at a rate of approximately 50 sccm, $GeH_4$ flowed at a rate of approximately 4.3 sccm, $H_2$ flowed at a rate of approximately 150 sccm, and a deposition time of approximately 90 seconds.

12. A method as defined in claim 6 wherein the second intrinsic layer is formed in a chamber having a pressure of approximately 43 mT using hot wire chemical vapor deposition including $SiH_4$ flowed at a rate of approximately 50 sccm, $GeH_4$ flowed at a rate of approximately 4.3 sccm, $H_2$ flowed at a rate of approximately 150 sccm, and a deposition time of approximately 90 seconds.

13. A method as defined in claim 6 wherein the second intrinsic layer has a germanium to silicon ratio (Ge/Si) of approximately 8%.

14. A method as defined in claim 6 wherein the third intrinsic layer is formed using hot wire chemical vapor deposition including $SiH_4$ flowed at a rate of approximately 50 sccm, $GeH_4$ flowed at a rate of approximately 9.5 sccm, and $H_2$ flowed at a rate of approximately 150 sccm.

15. A method as defined in claim 6 wherein the third intrinsic layer is formed using hot wire chemical vapor deposition including $SiH_4$ flowed at a rate of approximately 50 sccm, $GeH_4$ flowed at a rate of approximately 9.5 sccm, $H_2$ flowed at a rate of approximately 150 sccm, and a deposition time of approximately 90 seconds.

16. A method as defined in claim 6 wherein the third intrinsic layer is formed in a chamber having a pressure of approximately 45 mT using hot wire chemical vapor deposition including $SiH_4$ flowed at a rate of approximately 50 sccm, $GeH_4$ flowed at a rate of approximately 9.5 sccm, $H_2$ flowed at a rate of approximately 150 sccm, and a deposition time of approximately 90 seconds.

17. A method as defined in claim 6 wherein the third intrinsic layer has germanium to silicon ratio (Ge/Si) of approximately 16%.

18. A method as defined in claim 6 wherein the first, second, and third intrinsic layers are formed using hot wire chemical vapor deposition including $SiH_4$ flowed at a rate of approximately 50 sccm, and $H_2$ flowed at a rate of approximately 150 sccm.

19. A method as defined in claim 18 wherein the step in germanium to silicon percentage ratio (Ge/Si) exists between the second intrinsic layer and the third intrinsic layer where the second intrinsic layer has a germanium to silicon ratio (Ge/Si) of approximately 8%, and the third intrinsic layer has a germanium to silicon ratio (Ge/Si) of approximately 16%.

20. A method as defined in claim 18 wherein the first intrinsic layer has a germanium to silicon ratio (Ge/Si) of approximately 0%, and wherein the step in germanium to silicon percentage ratio (Ge/Si) exists between the second intrinsic layer and the third intrinsic layer where the second intrinsic layer has a germanium to silicon ratio (Ge/Si) of approximately 8%, and the third intrinsic layer has a germanium to silicon ratio (Ge/Si) of approximately 16%.

21. A method as defined in claim 18 wherein the second intrinsic layer is formed using $GeH_4$ flowed at a rate of approximately 4.3 sccm.

22. A method as defined in claim 18 wherein the third intrinsic layer is formed using $GeH_4$ flowed at a rate of approximately 9.5 sccm.

23. A method as defined in claim 18 wherein the second intrinsic layer is formed using $GeH_4$ flowed at a rate of approximately 4.3 sccm and the third intrinsic layer is formed using $GeH_4$ flowed at a rate of approximately 9.5 sccm.

* * * * *